(12) United States Patent
Takahashi

(10) Patent No.: US 6,300,814 B1
(45) Date of Patent: *Oct. 9, 2001

(54) STEP ATTENUATOR HAVING SHUNT CIRCUIT EQUIPPED WITH TRANSMISSION LINE

(75) Inventor: Kazutoshi Takahashi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/186,897

(22) Filed: Nov. 6, 1998

(30) Foreign Application Priority Data

Nov. 7, 1997 (JP) .................................................. 9-306246

(51) Int. Cl.$^7$ ....................................................... H03L 5/00
(52) U.S. Cl. ......................................... 327/308; 333/81 R
(58) Field of Search .......................... 327/308; 331/81 A, 331/81 R

(56) References Cited

U.S. PATENT DOCUMENTS

| 5,666,089 | * | 6/1999 | Ehlers | 333/81 R |
| 5,796,286 | * | 8/1998 | Otaka | 327/308 |
| 5,912,599 | * | 6/1999 | Beall | 333/81 R |

* cited by examiner

*Primary Examiner*—Kenneth B. Wells
(74) *Attorney, Agent, or Firm*—Sughrue, Mion, Zinn, Macpeak & Seas, PLLC

(57) ABSTRACT

A step attenuator whereby the attenuation setting error over a broad band is reduced disclosed. The step attenuator includes: resistors 5 and 6, connected in series between an input terminal 1 and an output terminal 2; a MOS-type FET 10 connected to resistors 5 and 6 in a parallel manner; and a frequency characteristic adjustment circuit 13 connected in series between the joint of the resistors 5 and 6, and a ground. The frequency characteristic adjustment circuit 13 includes: a transmission line 12 connected between the joint of the resistors 5 and 6, and resistor 7; and a MOS-type FET 11 connected to the resistor 7 in a parallel manner. The transmission line 12 is '$\lambda/4-\alpha$' ($0 \leq \alpha \leq \lambda/16$) in length, where $\lambda$ denotes the wave-length of a signal entering the input terminal.

11 Claims, 5 Drawing Sheets

STEP ATTENUATOR HAVING SHUNT CIRCUIT EQUIPPED WITH TRANSMISSION LINE

BACKGROUND OF THE INVENTION

1. Field of the Invention

The present invention relates to a step attenuator. It specifically relates to a step attenuator used within the microwave band.

2. Prior Art

An ideal feature of the step attenuator is that the difference between loss of the entered signal transmission in respective attenuation mode and through-mode (non-attenuation mode) stays constant over all the frequency bands. However, the ideal feature cannot be attained by using the conventional step attenuators. Specifically, the difference between the transmission loss of the entered signal in the respective attenuation mode and through-mode (non-attenuation mode) changes dependent upon the frequency of an entered signal.

As is mentioned above, since the conventional step attenuators have an attenuation setting error, using them for the purpose of providing a broad-band gain control causes low accuracy in gain settings. It is noted that we define the attenuation setting error to mean the error between the attenuation value, which is decided based upon the difference between the transmission losses in the respective through-mode and attenuation mode, and he default attenuation value.

The attenuation setting error may be a main factor in reducing the attenuation accuracy. Therefore, it is important to decrease the error over the broad band.

SUMMARY OF THE INVENTION

The present invention is provided to solve the above-mentioned problems. Thus, the objective of the present invention is to provide a step attenuator, comprising: a first and second resistors connected in series between an input terminal and an output terminal; a first attenuation changeover/setting circuit connected to the first and second resistors in series; and frequency characteristic adjustment circuit and a third resistor, both connected in series to the joint of the first and second resistors and a ground; wherein: the frequency characteristic adjustment circuit comprises: a transmission line connected between the joint of the first and second resistors, and the third resistor; and a second attenuation changeover/setting circuit connected to the third resistor in a parallel manner, with the transmission line being '$\lambda/4-\alpha$' ($0 \leq \alpha \leq \lambda/16$) in length, where $\lambda$ denotes the wave-length of a signal entered into the input terminal.

Another objective of the present invention is to provide a step attenuator, comprising: a plurality of step attenuators connected in series between a group of a plurality of input terminals and a group of a plurality of output terminals; with each step attenuator comprising: a first and second resistors connected in series between an input terminal and an output terminal; a first attenuation changeover/setting circuit connected to the first and second resistors in series; and a frequency characteristic adjustment circuit and a third resistor, both connected in series to the joint of the first and second resistors and a ground; wherein: the frequency characteristic adjustment circuit comprises: a transmission line connected between the joint of the first and second resistors, and the third resistor; and a second attenuation changeover/setting circuit connected to the third resistor in a parallel manner, with the transmission line being '$\lambda/4-\alpha$' ($0 \leq \alpha \leq \lambda/16$) in length, where $\lambda$ A denotes the wave-length of a signal entered into the input terminal.

BRIEF DESCRIPTION OF DRAWINGS

Other features and advantages of the invention will be made more apparent by the detailed description that follows, taken in conjunction with the accompanying drawings, wherein.

DETAILED DESCRIPTION OF THE PREFERRED EMBODIMENT

Prior to an explanation of an embodiment according to the present invention, an explanation will be given of a step attenuator, which will act as a reference compared to an attenuator according to the present invention. By following the operation and configuration of the step attenuator used as reference, there will be a better understanding of the advantage of the step attenuator according to the present invention.

Figure 5:
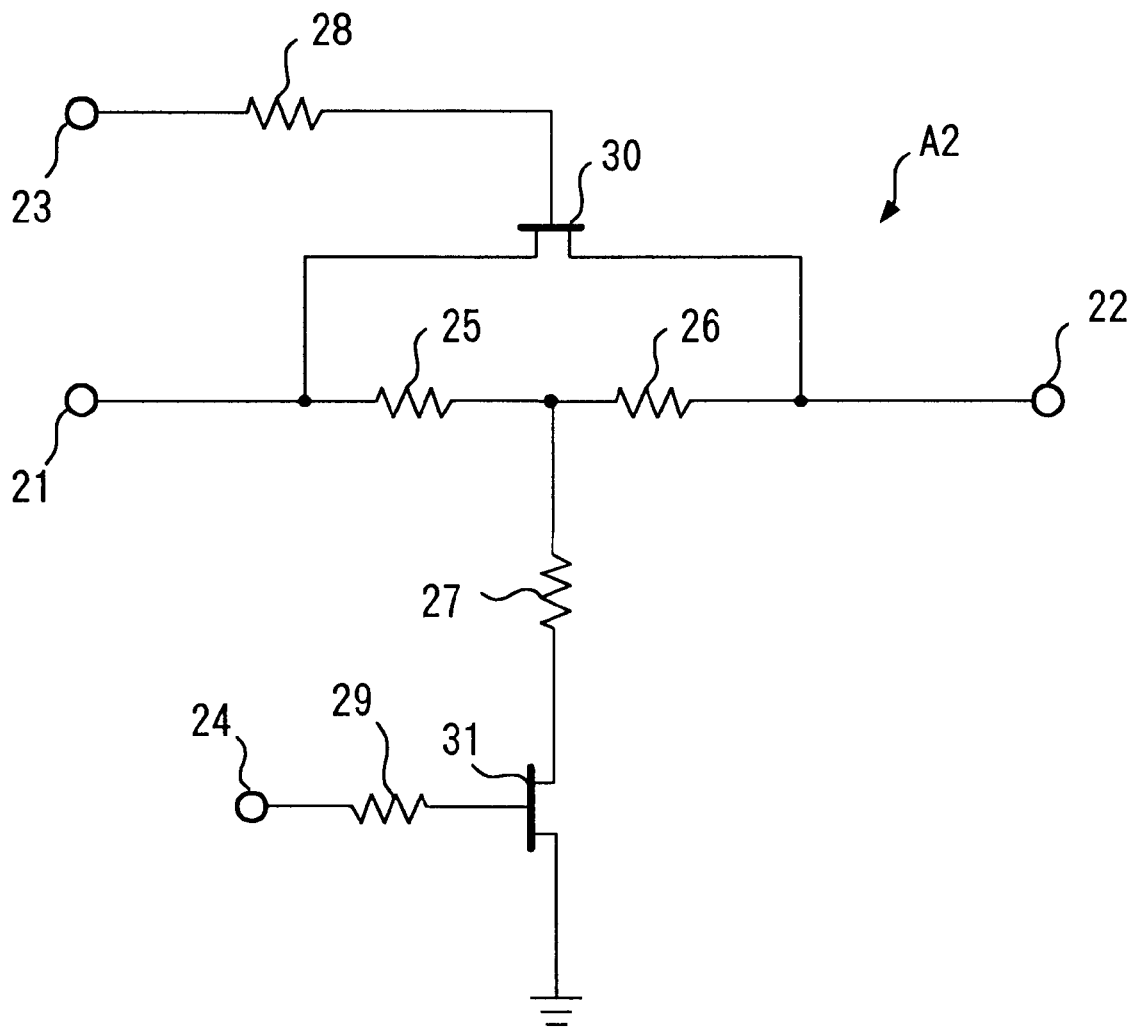
FIG. 5 shows the configuration of a step attenuator A2 as a reference.

FIG. 5 shows the configuration of a step attenuator A2 as a reference. As shown in FIG. 5, the step attenuator A2 is comprised of: an input terminal 21; an output terminal 22; control terminals 23 and 24; resistors 25, 26, and 27; resistors 28 and 29, which are used to protect the gates of MOS (Metal-Oxide Semiconductor)-type FETs (Field-Effect Transistors) 30 and 31; and the MOS-type FETs 30 and 31. This step attenuator is referred to as "T-shaped".

In order for the step attenuator A2 to enter to the through-mode or the non-attenuation mode, an "L" level control signal is applied to the control terminal 24 so that the MOS-type FET 31 enters an OFF-state, whereas a "H" level control signal is applied to the control terminal 23 so that the MOS-type FET 30 enters an ON-state. Accordingly, the input signal entering the input terminal 21 is output to the output terminal 22, via the parallel circuit made up of the resistors 25 and 26, and the MOS-type FET 30 which can be seen as an internal impedance.

On the other hand, in order for the step attenuator to enter the attenuation mode, an "H" level control signal is applied to the control terminal 24 so that the MOS-type FET 31 enters the ON-state, whereas an "L" level control signal is applied to the control terminal 23 so that the MOS-type FET 30 enters the OFF-state. Accordingly, the input signal entering the input terminal 21 is attenuated by both the resistors 25, 26, and 27, and the internal impedance of the MOS-type FET 30, and then output to the output terminal 22.

However, since the step attenuator A2 has a large attenuation setting error, a problem will occur where the gain setting accuracy deteriorates when it is used to conduct a broad-band gain control. It is noted that the definition of the attenuation error means the error between the attenuation value, dependent upon the difference between the transmission losses in the through-mode and attenuation mode, and the default attenuation value. This error emanates from the fact that the higher the frequency becomes, the worse both the parasitic capacitance and the capacitance between the drain and source of the MOS-type FETs 30 and 31 reduce the frequency characteristic, and also there is an increase in the transmission loss. Thereby the transmission losses in the through-made and attenuation mode differ.

Figure 6:
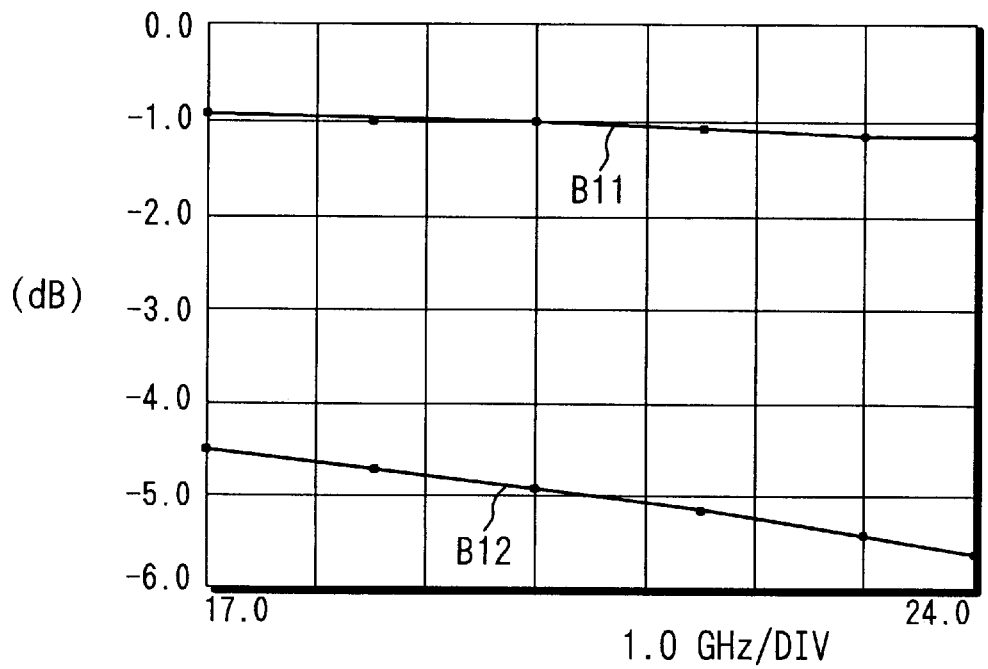
FIG. 6 is a graph showing the frequency characteristics of the step attenuator A2 obtained by experimentation.

The transmission loss in the through-mode made by the step attenuator A2 is shown by a characteristic curve B11 in FIG. 6, whereas the transmission loss in the attenuation mode is shown by a characteristic curve B12.

Figure 7:
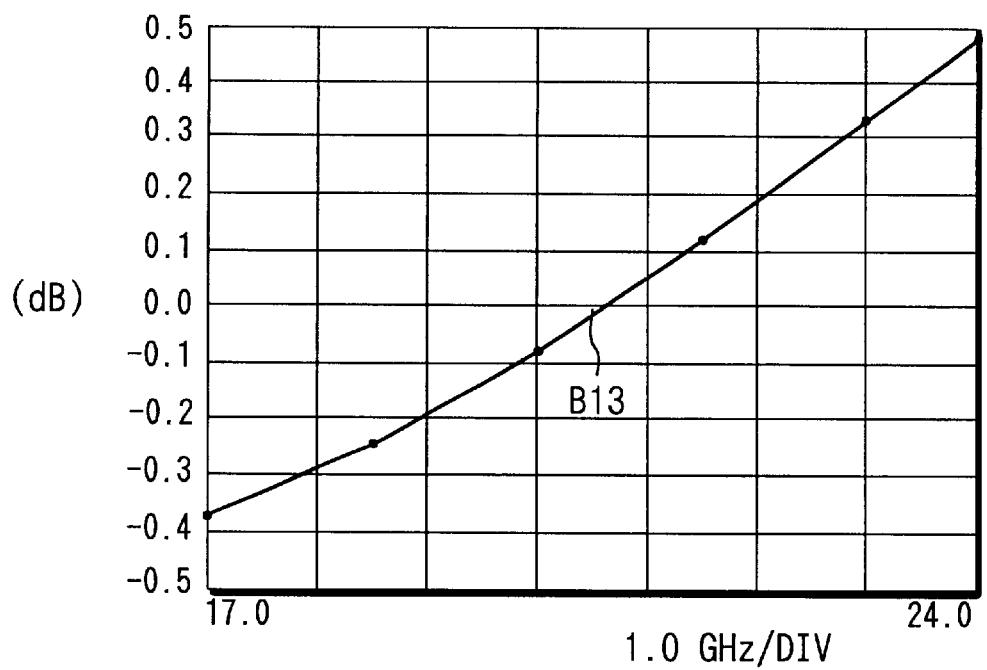
FIG. 7 is a graph showing the attenuation setting error of the step attenuator A2 obtained by an experiment.

Furthermore, the attenuation setting error in the step attenuator A2 is shown by a characteristic curve B13 in FIG. 7. As is apparent in FIG. 7, the attenuation setting error caused by the step attenuator A2 largely depends upon the frequency of the signal entered.

Next, a step attenuator according to the embodiment of the present invention will be explained hereafter.

Figure 1:
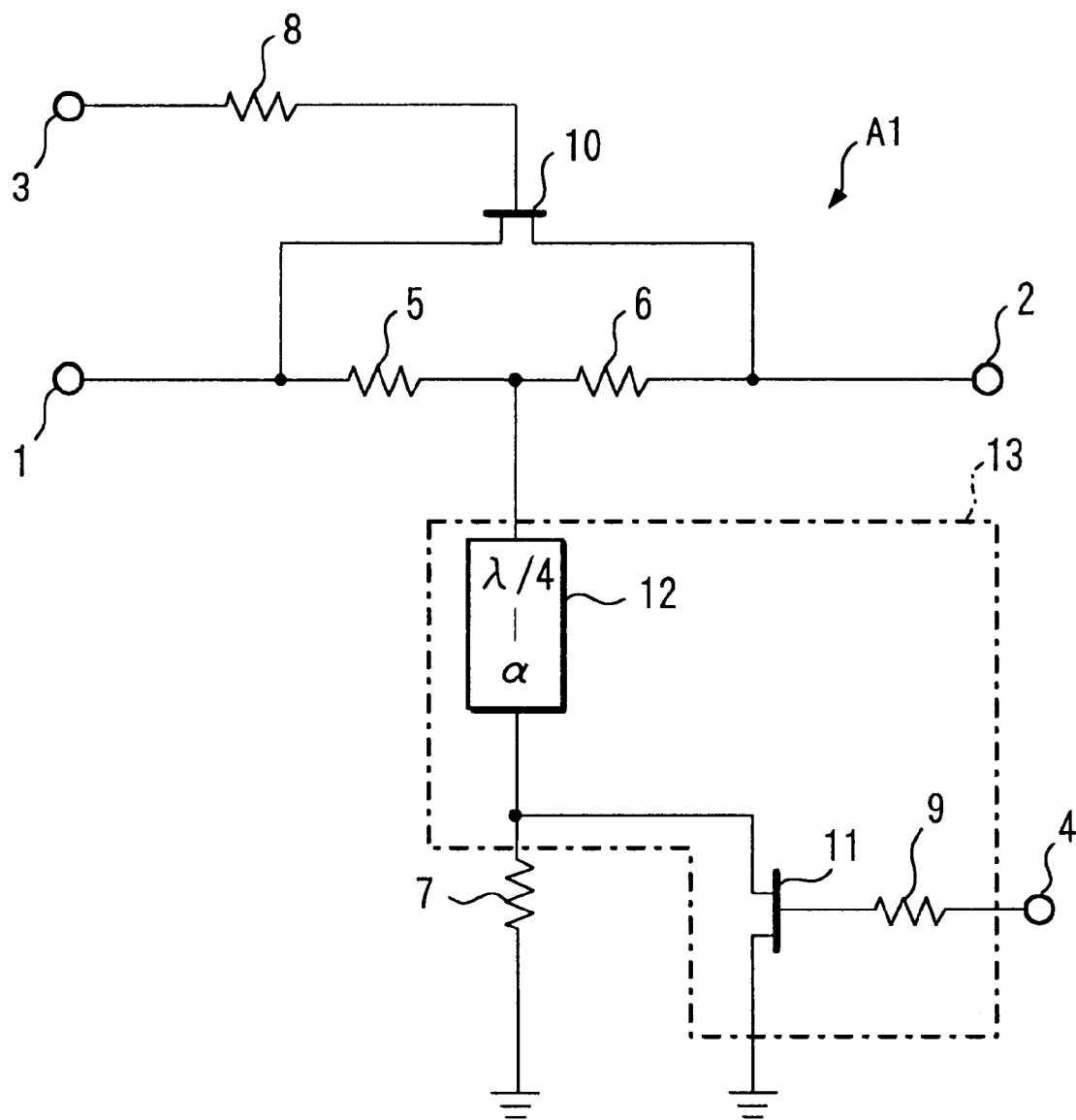
FIG. 1 is the configuration of a step attenuator A1 according to an embodiment of the present invention.

FIG. 1 shows the configuration of a step attenuator A1 according to the embodiment of the present invention. The step attenuator A1 is fabricated on the GaAs substrate of 80 $\mu$m in thickness of an LSI (Large-Scale Integration ), which is preferably used within the microwave band. However, the substrate is not limited to the material, and other related materials can also be alternatively used. For example, a silicon substrate can be used to fabricate the step attenuator A1. Otherwise, any other substrate on which another circuit along with the attenuator A1 is also fabricated, can be used. Moreover, a print-circuit board, on which discrete resistors and transistors, etc. are located and wired, can also be used in place of the semiconductor substrates.

As shown in FIG. 1, the attenuator A1 according to the embodiment of the present invention is comprised of: an input terminal 1; an output terminal 2; control terminals 3 and 4; resistors 5, 6, and 7; gate protection resistors 8 and 9; MOS-type FETs 10 and 11; and a transmission line 12. A frequency characteristic adjustment circuit 13 is made up of the MOS-type FET 11 and the transmission line 12. The transmission line 12 is '$\lambda/4-\alpha$' ($0 \leq \alpha \leq \lambda/16$) in length, where $\lambda$ denotes the wave-length of a signal entering the input terminal, and a denotes a correction term.

The resistors 5 and 6 are both connected in series between input terminal 1 and the output terminal 2. The MOS-type FET 10 is connected to the resistors 5 and 6 in a parallel manner. The MOS-type FET 10 is a leading element of a first attenuation changeover/setting circuit, which is used to changeover and set an attenuation mode. The frequency characteristic adjustment circuit 13 and the resistor 7 are both connected in series between the joint (shunt joint) of the resistors 5 and 6, and a ground. The frequency characteristic adjustment circuit 13 is comprised of: a transmission line 12 connected between the joint of resistors 5 and 6, and the resistor 7 in a parallel manner; and the MOS-type FET 11 connected to the resistor 7, in a parallel manner. The MOS-type FET 11 is an element of a second attenuator which is used to changeover and set in the attenuation mode.

Next, the operation of the step attenuator A1 according to the embodiment will be explained hereafter in detail.

First, in order for the step attenuator A1 to enter the through-mode or the non-attenuation mode, an "H" level control signal is applied to the control terminals 3 and 4 so that the MOS-type FETs 10 and 11 enter the ON-state. Where, since the transmission line 12 of '$\lambda/4-\alpha$' in length can be seen as a short-circuit when is observed from the shunt joint, the resulting impedance of the shunt circuit is infinitely great. Therefore, all the signals entering the attenuator are output to the output terminal 2. In this case, the frequency characteristic is almost level due to the fact that the shunt circuit cannot be observed.

On the other hand, in order for the step attenuator A1 to enter the attenuation mode, an "L" level signal is applied to the control terminals 3 and 4 so that the MOS-type FETs 10 and 11 enter in the OFF-state. Since the parallel circuit, made up of: the capacitance between the drain and source of the MOS-type FET 11; the parasitic capacitance; and a third resistor, can be seen as a capacitive impedance when the shunt circuit is observed from the shunt joint, the resulting impedance of the shunt circuit can be seen as inductive, through impedance transformation by the transmission line 12 of '$\lambda/4-\alpha$' in length. Therefore, the higher the frequency of the signal entered becomes, the higher the impedance becomes. Specifically, since the shunt circuit of the T-shaped step attenuator A1 becomes higher in impedance, the attenuation value (transmission loss) becomes lower. As a result, the possible transmission loss within the high frequency band is prevented from increasing. Accordingly, the possible frequency loss can stay level. Therefore, in the step attenuator A1 according to the present invention, the frequency characteristics in the respective through-mode and the attenuation mode are level over a broad band, and the attenuation setting error can be also reduced over the broad band.

The substrate of the MOS-type FETs 10 and 11 is made of the GaAs of 80 $\mu$m in thickness, and the gate width of the MOS-type FETs 10 and 11 is equal to 400 $\mu$m. The resistors 5 and 6 in the step attenuator A1 are both set to 11.2Ω, and the resistor 7 is set to 47.6Ω. The gate protection resistors 8 and 9 are both set to 4KΩ. The voltages applied to the control terminals 3 and 4 are equal to 0V ("H" level ) or –5V ("L" level ). It is noted that the correction term $\alpha$ is equal to 200 $\mu$m, and the characteristic impedance is equal to 50Ω.

Figure 2:
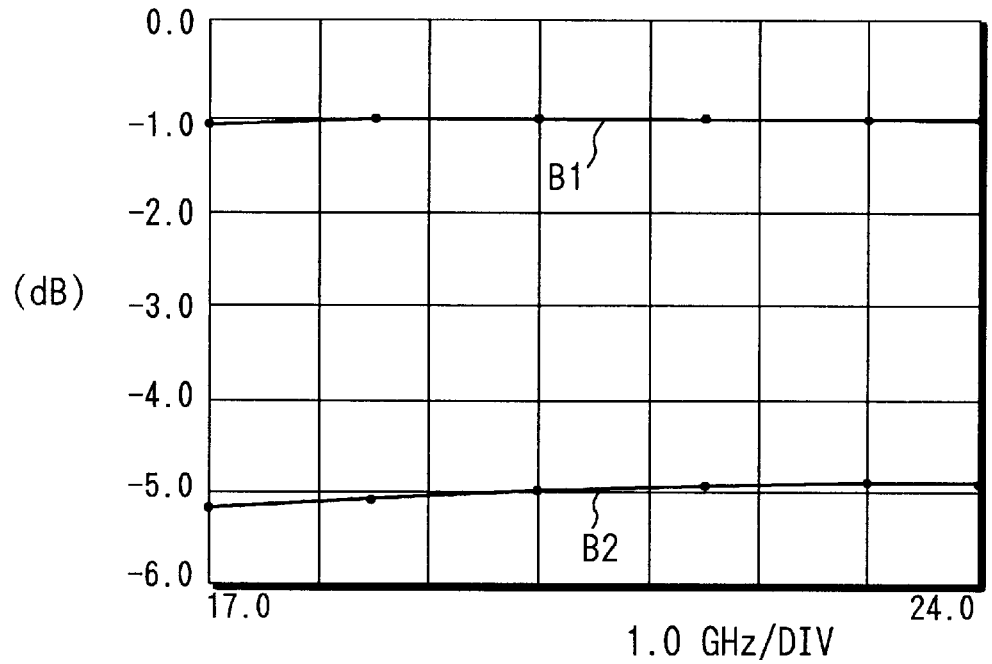
FIG. 2 is a graph showing the frequency characteristics of the step attenuator A1 obtained by experimentation.
Figure 3:
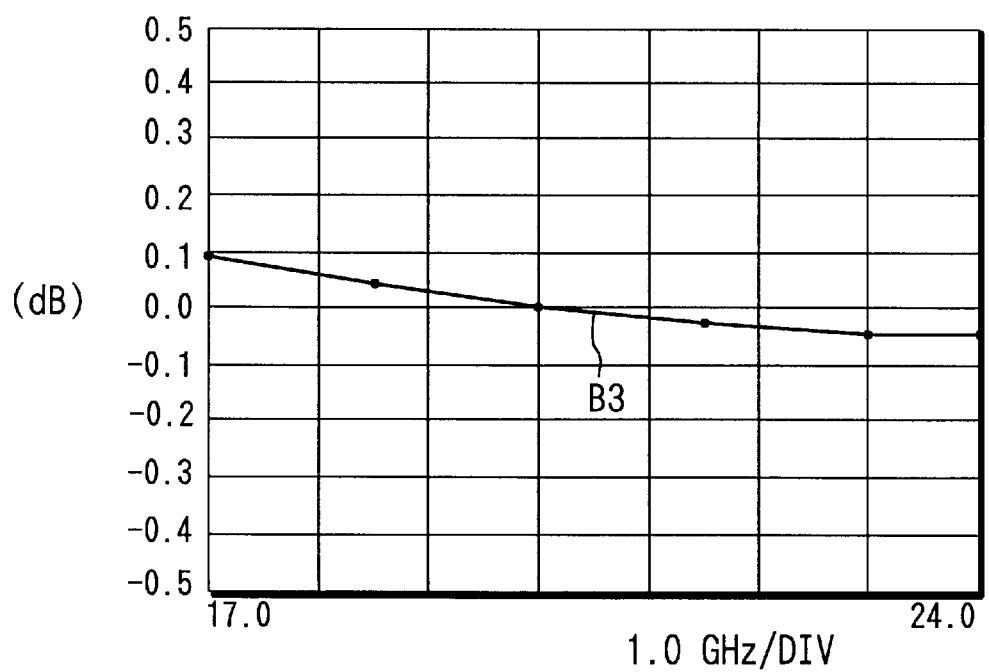
FIG. 3 is a graph showing the attenuation setting error of the step attenuator A1 obtained by an experiment.

Next, the characteristics of the step attenuator A1 according to the embodiment will be explained with reference to FIGS. 2 and 3. The transmission loss in the through-mode caused by the step attenuator A1 is shown by a characteristic curve B1 in FIG. 2, whereas the transmission loss in the attenuation mode is shown by a characteristic curve B2. The attenuation setting error caused by the step attenuator A1 is shown by a characteristic curve B3 in FIG. 3. As shown in FIG. 3, the attenuation setting error made by the step attenuator A1 according to the embodiment has been improved approximately ±0.3 dB more than that of the step attenuator A2.

Figure 4:
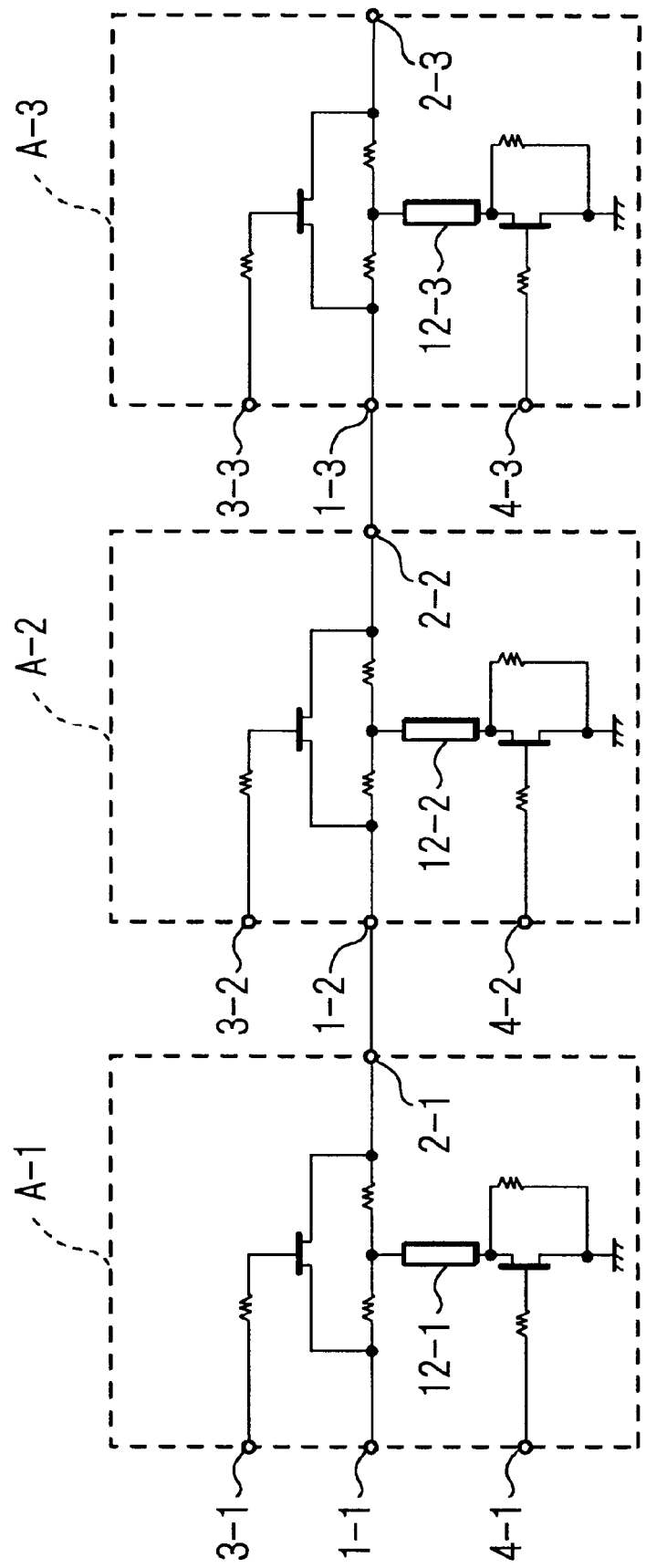
FIG. 4 shows the configuration where several step attenuators A1 are connected in series.

Furthermore, as shown in FIG. 4, a plurality of step attenuators A1 can be connected in series. In this configuration with several step attenuators A1 connected in series, a multi-bit attenuator, which gives a variety of attenuation values, can be obtained. Step attenuators A1-1, A1-2, and A1-3 in FIG. 4 are all configured in the same manner as that of the step attenuator A1 shown in FIG. 1. However, they have different attenuation values in the attenuation mode. For example, their values are set so that the attenuation values of the step attenuators A1-1, A1-2, and A1-3 can be equal to 1 dB, 2 dB, and 4 dB, respectively.

With the aforementioned configuration, the signals entered into input terminals 1-1 to 1-3 are output to an output terminal 2-3 without any attenuation possibly caused by the step attenuators A1-1, A1-2, and A1-3. Each mode (either the attenuation mode or the through-mode) of the step attenuators A1-1 to A1-3 is determined by the voltages (logical levels) applied to control terminals 3-1 and 4-1, 3-2 and 4-2, and 3-3 and 4-3. The control method is the same as that of the step attenuator A1.

Furthermore, the number of step attenuators connected in series is not limited, and, for example, two or four step attenuators can be connected. The attenuation values of the respective step attenuators A1-1 to A1-3 in the attenuation mode are all not limited to the aforementioned attenuation values, and 3 dB, 6 dB, and 12 dB, for example, can be set to them, respectively. It is noted that the attenuation values in the attenuation mode in the respective step attenuators are preferably set to the ones binary-weighted by 1, 2, 4, 8, . . . so that the finest attenuation value control can be conducted.

As is described above, according to the present invention, the frequency characteristic in the attenuation mode can stay level over a broad band. Accordingly, the attenuation setting error can be also decreased over the broad band.

Note that many apparently widely different characteristics of the present invention can be used without departing from the spirit and scope thereof; it is to be understood that the invention is not limited to the specific features thereof; except as defined in the appended claims.

What is claimed is:

1. A step attenuator, comprising:

first and second resistors connected in series between an input terminal supplied with an input signal and an output terminal;

a first switch connected between said input terminal and said output terminal in parallel to said first and second resistors; and a shunt circuit including a transmission line having a first end continuously connected to a joint of said first and second resistors and a second end, and a third resistor and a second switch connected in parallel between the second end of said transmission line and a reference potential point;

said transmission line being $\lambda/4-\alpha(0 \leq \alpha \leq \lambda/16)$ in length, where $\lambda$ denotes the wave-length of said input signal;

said first and second switches being turned ON in a through-mode so that said shunt circuit represents such a first impedance that allows said input signal to pass through said first switch and appear at said output terminal; and said first and second switches being turned OFF in a attenuation-mode so that said shunt circuit represents such a second impedance that is lower than said first impedance to allow a part of said input signal to flow through said shunt circuit into said reference potential point.

2. The step attenuator according to claim 1, wherein each of first and second switches includes an FET.

3. The step attenuator according to claim 1, where said reference potential point is a ground.

4. The step attenuator according to claim 1, wherein said shunt circuit represents an inductive impedance in said attenuation-mode.

5. A step attenuator, comprising:

first and second resistors connected in series between an input terminal supplied with an input signal and an output terminal;

a first FET connected between said input terminal and said output terminal in parallel to said first and second resistors; and a shunt circuit including a transmission line having a first end continuously connected to a joint of said first and second resistors and a second end, and a third resistor and a second FET connected in parallel between the second end of said transmission line and a ground;

said transmission line being approximately $\lambda/4$ in length, where $\lambda$ denotes the wave-length of said input signal;

said first and second FETs being turned ON in a through-mode so that said shunt circuit represents such a first impedance that allows said input signal to pass through said first FET and appear at said output terminal; and said first and second FETs being turned OFF in a attenuation-mode so that said shunt circuit represents such a second impedance that is lower than said first impedance to allow a part of said input signal to flow through said shunt circuit into said ground.

6. The step attenuator according to claim 5, wherein said transmission line is $\lambda/4-\alpha(0 \leq \alpha \leq \lambda/16)$ in length.

7. A step attenuator, comprising input and output terminals, a plurality of unit circuits, each having input and output ends, said unit circuits being coupled in series between said input terminal and said output terminal in such a manner that the output end of a preceding one of said unit circuits is connected to the input end of a succeeding one of said unit circuits comprising:

first and second resistors connected in series between the input and output ends;

a first switch connected between said input end and said output end in parallel to said first and second resistors; and a shunt circuit including a transmission line having a first point continuously connected to a joint of said first and second resistors and a second point, and a third resistor and a second switch connected in parallel between the second point of said transmission line and a reference potential point;

said transmission line being approximately $\lambda/4$ in length, where $\lambda$ denotes the wave-length of a signal entering the input end;

said first and second switches being turned ON in a through-mode so that said shunt circuit represents such a first impedance that allows said input signal to pass through said first switch and appear at said output end; and said first and second switches being turned OFF in a attenuation-mode so that said shunt circuit represents such a second impedance that is lower than said first impedance to allow a part of said signal to flow through said shunt circuit into said reference potential point.

8. The step attenuator according to claim 7, wherein each of said first and second switches includes an FET.

9. The step attenuator according to claim 7, wherein said reference potential point is a ground.

10. The step attenuator according to claim 7, wherein said shunt circuit represents an inductive impedance in said attenuation-mode.

11. The step attenuator according to claim 7, wherein said transmission line is $\lambda/4-\alpha(0 \leq \alpha \leq \lambda/16)$ in length.

* * * * *